(12) United States Patent
Chen et al.

(10) Patent No.: US 11,538,714 B2
(45) Date of Patent: Dec. 27, 2022

(54) SYSTEM APPARATUS AND METHOD FOR ENHANCING ELECTRICAL CLAMPING OF SUBSTRATES USING PHOTO-ILLUMINATION

(71) Applicant: Applied Materials, Inc., Santa Clara, CA (US)

(72) Inventors: Qin Chen, Santa Clara, CA (US); Julian G. Blake, Gloucester, MA (US); Michael W. Osborne, Clinton, MA (US); Steven M. Anella, West Newbury, MA (US); Jonathan D. Fischer, Lynn, MA (US)

(73) Assignee: Applied Materials, Inc., Santa Clara, CA (US)

( * ) Notice: Subject to any disclaimer, the term of this patent is extended or adjusted under 35 U.S.C. 154(b) by 108 days.

(21) Appl. No.: 16/880,518

(22) Filed: May 21, 2020

(65) Prior Publication Data

US 2021/0366759 A1 Nov. 25, 2021

(51) Int. Cl.
*H01L 21/68* (2006.01)
*H01L 21/687* (2006.01)
*H01L 21/683* (2006.01)

(52) U.S. Cl.
CPC .. *H01L 21/68721* (2013.01); *H01L 21/68728* (2013.01); *H01L 21/6833* (2013.01)

(58) Field of Classification Search
CPC ......... H01L 21/68721; H01L 21/68728; H01L 21/6833; H01L 21/67115; H01L 21/68764
See application file for complete search history.

(56) References Cited

U.S. PATENT DOCUMENTS

| | | | |
|---|---|---|---|
| 6,359,678 B1 * | 3/2002 | Ota | G03F 7/70283 250/548 |
| 6,507,029 B1 | 1/2003 | Nishimura et al. | |
| 7,604,906 B1 * | 10/2009 | Volk | B82Y 10/00 430/311 |
| 2002/0076490 A1 | 6/2002 | Chiang et al. | |
| 2006/0284116 A1 * | 12/2006 | Berrian | H01J 37/3171 250/492.21 |

(Continued)

FOREIGN PATENT DOCUMENTS

| | | |
|---|---|---|
| DE | 4124903 A1 | 1/1993 |
| EP | 2706556 B1 | 5/2017 |

(Continued)

OTHER PUBLICATIONS

International Search Report and Written Opinion dated Aug. 27, 2021, for the International Patent Application No. PCT US2021/031239, filed on May 7, 2021, 8 pages.

(Continued)

*Primary Examiner* — Mohammed Shamsuzzaman
(74) *Attorney, Agent, or Firm* — KDB Firm PLLC

(57) ABSTRACT

An apparatus may include a clamp to clamp a substrate wherein the clamp is arranged opposing a back side of the substrate; and an illumination system, disposed to direct radiation to the substrate, when the substrate is disposed on the clamp, wherein the radiation comprises a radiation energy, equal to or above a threshold energy to generate mobile charge in the substrate, where the illumination system is disposed to direct radiation to the back side of the substrate.

9 Claims, 10 Drawing Sheets

(56) References Cited

U.S. PATENT DOCUMENTS

| | | | |
|---|---|---|---|
| 2007/0195482 A1* | 8/2007 | Muka | H01L 21/6833 361/234 |
| 2008/0186482 A1 | 8/2008 | Den Boef et al. | |
| 2009/0079525 A1* | 3/2009 | Sijben | G03F 7/70708 335/75 |
| 2013/0033690 A1 | 2/2013 | Helmus et al. | |
| 2014/0273504 A1* | 9/2014 | Nainani | H01L 21/02277 438/758 |
| 2014/0318455 A1* | 10/2014 | Blake | H01L 21/6831 118/725 |
| 2016/0007412 A1* | 1/2016 | Busche | H05B 3/14 392/408 |
| 2016/0135274 A1 | 5/2016 | Fischer et al. | |
| 2016/0260612 A1 | 9/2016 | Price et al. | |
| 2017/0207063 A1* | 7/2017 | Osborne | H01J 37/026 |
| 2017/0263487 A1 | 9/2017 | Boyd et al. | |
| 2017/0350000 A1 | 12/2017 | Kekkonen et al. | |
| 2018/0040452 A1* | 2/2018 | Hatakeyama | H01J 37/12 |
| 2019/0101838 A1 | 4/2019 | Chen et al. | |
| 2021/0050245 A1 | 2/2021 | Choi et al. | |
| 2021/0366689 A1* | 11/2021 | Chen | H01J 37/20 |
| 2021/0366756 A1* | 11/2021 | Chen | H05B 1/0233 |
| 2021/0366757 A1* | 11/2021 | Chen | H01L 21/68721 |

FOREIGN PATENT DOCUMENTS

| | | |
|---|---|---|
| EP | 2875404 B1 | 8/2019 |
| TW | 201801238 A | 1/2018 |
| WO | 2014018693 A1 | 1/2014 |
| WO | 2015163875 A1 | 10/2015 |

OTHER PUBLICATIONS

International Search Report and Written Opinion dated Aug. 27, 2021, for the International Patent Application No. PCT US2021/031241, filed on May 7, 2021, 7 pages.
International Search Report and Written Opinion dated Aug. 30, 2021, for the International Patent Application No. PCT/US2021/031240, filed on May 7, 2021, 7 pages.
https://www.esourceoptics.com/vuvmirrorcurves.html, 2 pages.
https://www.esourceoptics.com/vuvmirrors.html, 2 pages.
https://gargantua.polytechnique.fr/siatel-web/linkto/mICYYYUAb5Z, 28 pages.
https://www.hamamatsu.com/us/en/product/light-and-radiation-sources/lamp-module_unit/vuv-light-source-unit/index.html, 2 pages.
http://resonance.on.ca/continuum-source-arcm-lhp/, 4 pages.
R. Sokel et al, "Numerical analysis of transient photoconductivity in insulators," J. Appl. Phys., vol. 53, p. 7414(1982), 12 pages.
R.J.Powell, "Hole photocurrents and electron tunnel injection induced by trapped holes in SiO2 films," J. Appl. Phys., vol. 46, p. 4557 (1975), 8 pages.
Jenny et al, "Development .of Large Diameter High-Purity Semi-Insulating 4H-SiC Wafers for Microwave Devices," Mater. Sci. Forum, vols. 457-460, pp. 35-40, (2004), 6 pages.
Z.A.Weinberg et al, "Transmission, photoconductivity, and the experimental band gap of thermally grown SiO2 films," Phys. Rev. B, vol. 19, p. 3107 (1979), 12 pages.

* cited by examiner

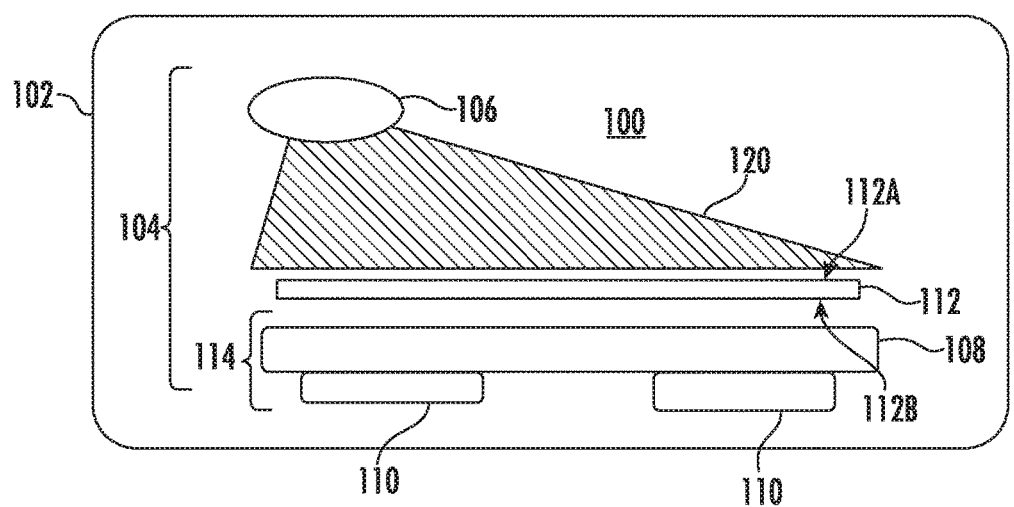
FIG. 1
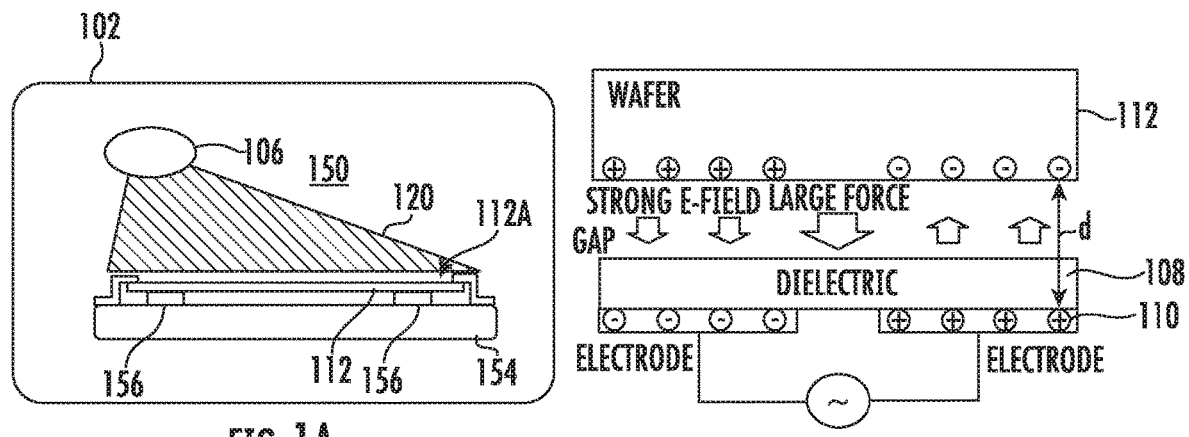
FIG. 1A
FIG. 1B
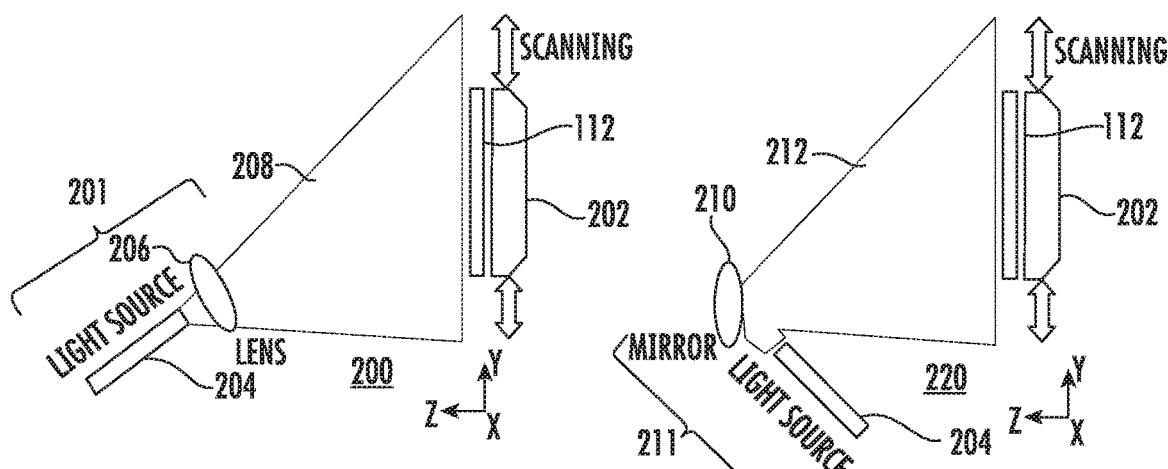
FIG. 2
FIG. 3

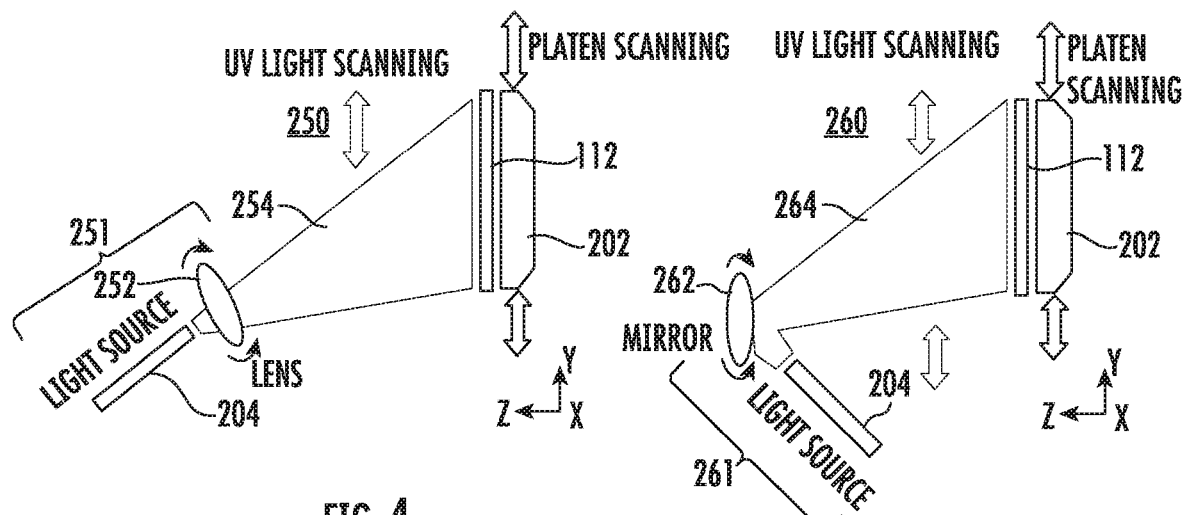
FIG. 4
FIG. 5
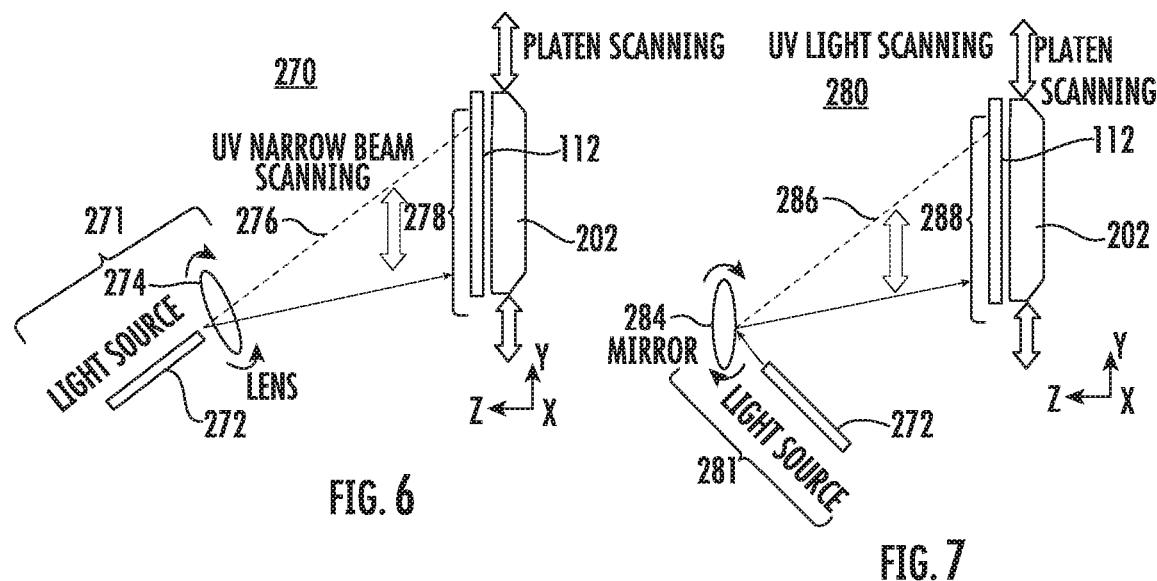
FIG. 6
FIG. 7
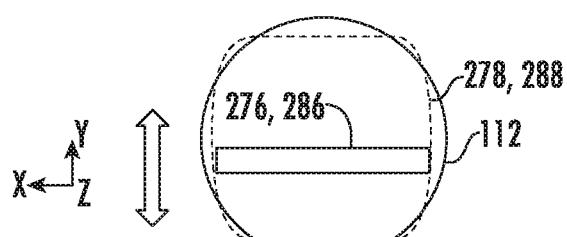
FIG. 7B
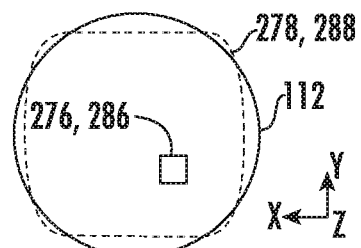
FIG. 7C

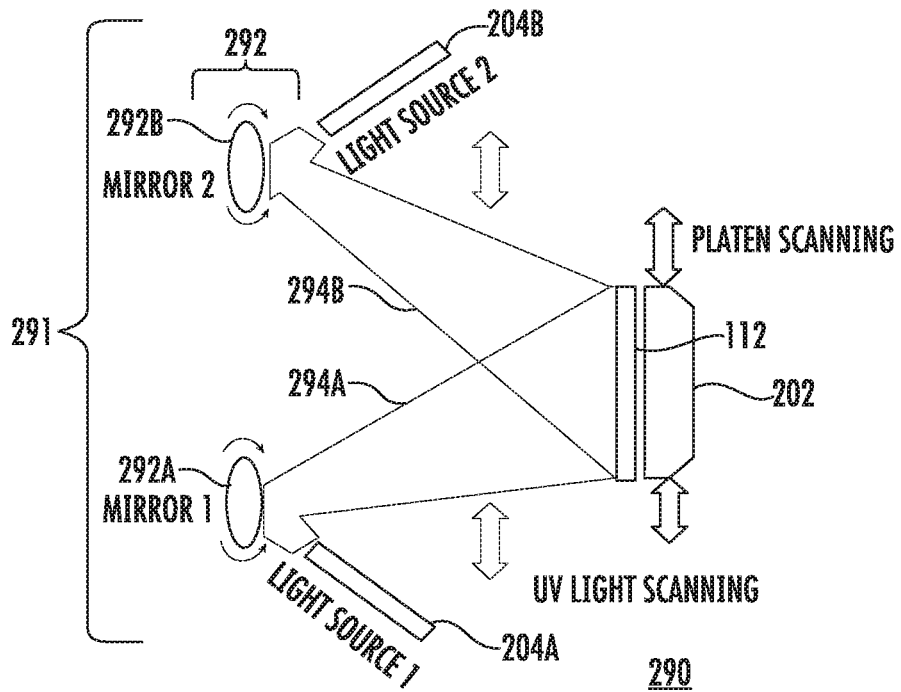
FIG. 8
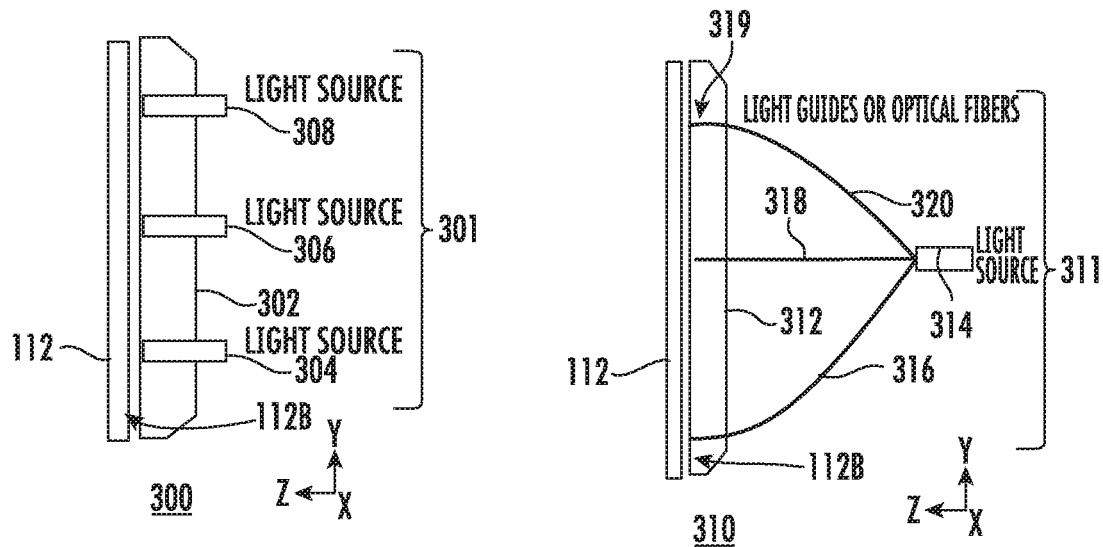
FIG. 9
FIG. 10

SYSTEM APPARATUS AND METHOD FOR ENHANCING ELECTRICAL CLAMPING OF SUBSTRATES USING PHOTO-ILLUMINATION

FIELD

The present embodiments relate to substrate processing, and more particularly, to electrostatic clamps for holding substrates.

BACKGROUND

Substrate holders such as electrostatic clamps (also referred to as electrostatic chucks) are used widely for many manufacturing processes including semiconductor manufacturing, solar cell manufacturing, and processing of other components. Electrostatic clamping uses the principle of electrostatic induction where electrical charge is redistributed in an object due to the direct influence of nearby charges. For example, a positively charged object near an electrically neutral substrate will induce a negative charge on the surface of the substrate. This charge creates an attractive force between the object and substrate. For the clamping of electrically conductive substrates and semiconductive substrates having relatively lower bulk resistivity, the redistribution of charge is readily accomplished by applying a voltage to an electrode that is embedded in an insulator adjacent the conductive substrate. Thus, electrostatic clamps have come into widespread use for holding semiconductor substrates, such as silicon wafers having a relatively lower bulk resistivity.

One type of electrostatic clamp applies an AC voltage to generate clamping, allowing for rapid clamping and declamping of a conductive substrate or low resistivity semiconductive substrate. However, known DC electrostatic clamps or AC electrostatic clamps are ineffective in clamping high resistivity semiconductor substrates or electrically insulating substrates.

In addition, substrate charging issues may adversely affect substrate processing, in particular for processing of high resistance substrates, such as in ion implantation. In addition to electrostatic clamps, non-electrostatic clamps, such as mechanical clamps may incorporate conductive lift pins, ground pins, where the operation of such pins may be compromised when a substrate being clamped is highly resistive. In addition, in ion implantation apparatus, charge buildup on a substrate during implantation may require the use of charge compensation such as electron flood guns to counter charging of the substrate.

It is with respect to these and other considerations that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an apparatus may include a clamp to clamp a substrate wherein the clamp is arranged opposing a back side of the substrate. The apparatus may have an illumination system, disposed to direct radiation to the substrate, when the substrate is disposed on the clamp, wherein the radiation comprises a radiation energy that is equal to or above a threshold energy to generate mobile charge in the substrate, the illumination system being disposed to direct radiation to the back side of the substrate.

In another embodiment, a substrate processing system may include a process chamber and an electrostatic clamp, disposed in the process chamber, the electrostatic clamp to clamp a substrate, wherein the electrostatic clamp is arranged opposing a back side of the substrate. The substrate processing system may also include an illumination system, disposed to direct radiation to a the back side of the substrate, when the substrate is disposed on the electrostatic clamp, wherein the radiation comprises a radiation energy, the radiation energy being equal to or above 2.5 eV.

In a further embodiment, an ion implantation system may include a set of beamline components to generate and ion beam and direct the ion beam to a substrate and a clamp, to clamp the substrate wherein the electrostatic clamp is arranged opposing a back side of the substrate. The ion implantation system may include an illumination system, disposed to direct radiation to the back side of the substrate, when the substrate is disposed on the clamp, wherein the radiation comprises a radiation energy, the radiation energy being equal to 2.5 eV.

BRIEF DESCRIPTION OF THE DRAWINGS

FIG. 1 depicts an electrostatic clamp apparatus according to embodiments of the disclosure;

FIG. 1A depicts a clamp apparatus according to other embodiments of the disclosure;

FIG. 1B illustrates an instance of electrostatic clamping;

FIG. 2 depicts a side view of an electrostatic clamp apparatus according to various embodiments of the disclosure;

FIG. 3 depicts a side view of another electrostatic clamp apparatus according to various embodiments of the disclosure;

FIG. 4 depicts a side view of a further electrostatic clamp apparatus according to various embodiments of the disclosure;

FIG. 5 depicts a side view of a still another electrostatic clamp apparatus according to various embodiments of the disclosure;

FIG. 6 depicts a side view of an additional electrostatic clamp apparatus according to various embodiments of the disclosure;

FIG. 7 depicts a side view of a another electrostatic clamp apparatus according to various embodiments of the disclosure;

FIG. 7B and FIG. 7C depict the geometry of scanned radiation beams according to two different embodiments;

FIG. 8 depicts a side view of a still another electrostatic clamp apparatus according to various embodiments of the disclosure;

FIG. 9 depicts a side view of an additional electrostatic clamp apparatus according to various embodiments of the disclosure;

FIG. 10 depicts a side view of a another electrostatic clamp apparatus according to various embodiments of the disclosure;

DETAILED DESCRIPTION

Figure 11:
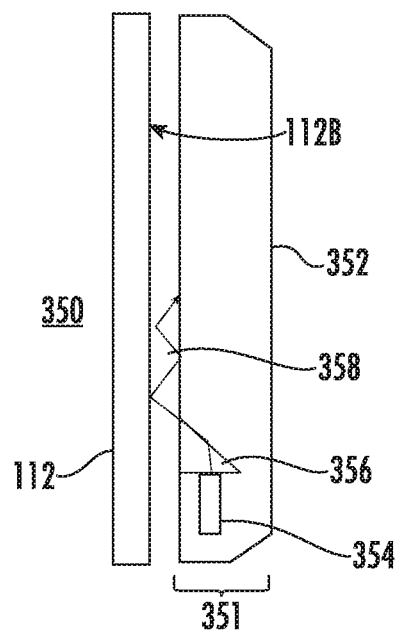
FIG. 11 depicts a side view of a another electrostatic clamp apparatus according to various embodiments of the disclosure.

The present embodiments provide apparatus and techniques to increase capability of substrate clamping. In various embodiments, a clamp apparatus, and processing system are disclosed suitable for clamping a variety of substrates, including high resistivity substrates. Various embodiments employ radiation sources capable of generating visible light, as well as radiation of shorter wavelengths, including wavelengths in the ultraviolet (UV) range and in the vacuum ultraviolet (VUV) range (<200 nm). Accordingly, various embodiments provide what may be termed photo-assisted electrical clamping and releasing of a variety of substrates, including illuminating a substrate with radiation before clamping, during clamping, and after clamping.

FIG. 1 depicts an electrostatic clamp system 100 according to embodiments of the disclosure. The electrostatic clamp system 100 may be deployed in any suitable environment where substrates are to be clamped for any suitable purpose. In various embodiments, the electrostatic clamp system 100 may be arranged in a substrate chamber 102 to house a substrate 112. In various non-limiting embodiments, the substrate chamber 102 may represent a load chamber to load a substrate 112 into a system, a transfer chamber, to transfer the substrate 112 between locations, or a process chamber, where the substrate 112 is to be subjected to at least one process. Suitable process chambers include chambers for layer deposition on the substrate 112, for etching of the substrate 112, for heating of the substrate 112, for ion implantation into the substrate 112, or for other suitable process.

As shown in the FIG. 1, the electrostatic clamp system 100 may include a clamp apparatus 104 that includes an electrostatic clamp component 114. The electrostatic clamp component 114 may include known components of known electrostatic clamps including cooling blocks, heaters, gas channels, electrodes, wiring, and so forth. For clarity, just general components of the electrostatic clamp component 114 are shown. As illustrated in FIG. 1, the electrostatic clamp component 114 may include an insulator portion 108 to directly support the substrate 112, as well as an electrode assembly 110 to apply a voltage to the insulator portion 108. The electrode assembly 110 may include at least one electrode and may be operable to apply a DC voltage or an AC voltage in different embodiments. In some embodiments, the electrostatic clamp system 100 may function as in known electrostatic clamps to clamp a low resistivity substrate.

As further shown in FIG. 1, the clamp apparatus 104 may further include an illumination system 106, disposed to direct radiation, shown as radiation 120, to the substrate 112. According to various embodiments, the radiation 120 may be characterized by a radiation energy that is equal to or above a threshold energy to generate mobile charge in the substrate 112. In this manner, the illumination system 106 may generate radiation 120 while a clamping voltage is applied to the electrostatic clamp component 114. Thus, in operation, and with reference to FIG. 1B, when the substrate 112 is clamped by the electrostatic clamp component 114, charges that are present within the substrate 112 may move over to the electrodes of the electrode assembly 110, with the opposite polarity to create a high electric field and generate a large clamping force.

Figure 16:
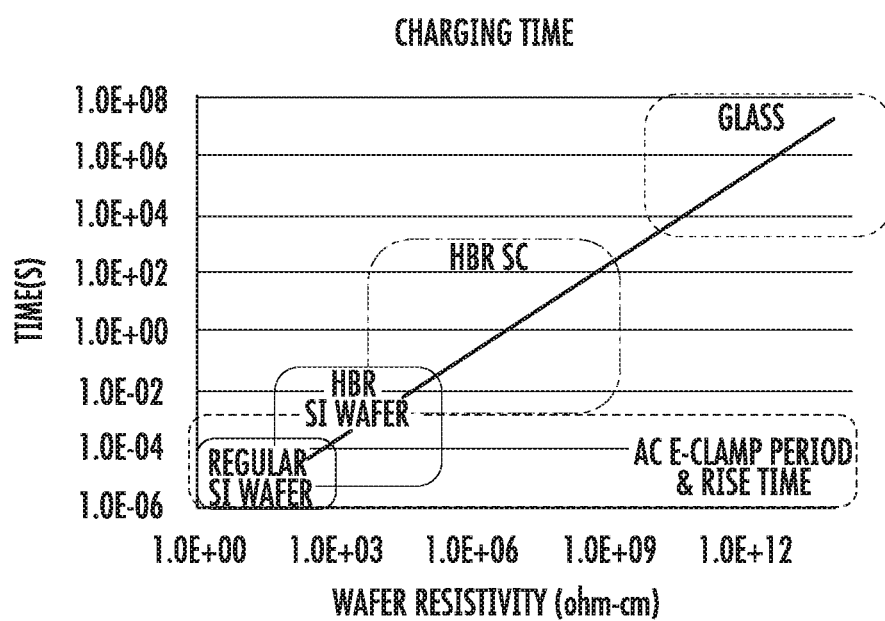
FIG. 16 illustrates the relationship between charging time and resistivity for different substrate types.

Notably, the time required for such charge motion depends on the resistivity of the substrate 112, as illustrated in FIG. 16. In FIG. 16 there are shown a range of resistivities and response time for charge for different types of common substrates. The response times are shown for substrates clamped with a clamping voltage without application of the illumination system 106. Substrates termed "regular Si wafer" represent a range of resistivity for relatively lower resistance silicon wafers, showing resistivity in the range of roughly 1 Ohm-cm to 1000 Ohm-cm. In this example, the response time is approximately 1 µs to 100 µs. Also shown in FIG. 16 is the rise time and clamp period for an AC clamp. As shown, this rise time is consistent with the response time for regular silicon wafers. FIG. 16 also shows the response time for charge in high bulk resistivity silicon wafers (HBR Si wafer), HBR silicon carbide wafers (HBR SiC), and glass substrates. Notably, the bulk resistivities of these other substrates extend above 10-2 seconds up to 108 seconds in the case of glass substrates. These longer response times mean that charge cannot move within these substrates within a time period consistent with application of an AC voltage. Additionally, even with application of a DC voltage, response time would be too slow for practical processing purposes, especially for HBR SiC and glass.

When the resistivity of the substrate 112 is too high, the charges cannot move fast enough to establish clamp force when the clamp voltage is applied by the electrostatic clamp component 114. For insulating substrates such as glass wafers, the charging time is practically infinite compared to the time scale associated with clamping and processing the substrate 112, which duration may be on the order of seconds up to several minutes. As such, absent the use of the illumination system 106 essentially no substrate charge is generated in response to applied clamp voltage, so that the clamp force is nearly zero.

Thus, with the use of the clamp apparatus 104, clamping of substrates including HBR semiconductor wafers and glass is made possible. In addition to addressing the problem of clamping of high resistivity substrates, the clamp apparatus 104 helps address another problem, the generation of unwanted charge on high resistivity substrates, where removal of such charge, e.g., due to triboelectricity, is very difficult. By generating mobile charge on the substrate 112, the clamp apparatus 104 additionally facilitates declamping of substrates. The high resistivity in insulating materials originate from different factors. Firstly, these materials usually have very large electronic bandgaps. For example for silicon oxide, such as $SiO_2$ the bandgap is approximately 8 eV. Unlike dopants in semiconductors, the impurities in the insulators also have a much higher ionization energy. As a result, the mobile charge concentration in such substrates is very low. Secondly, many of the common insulating materials are amorphous, such as the silica glasses. The lack of periodic crystal structure results in relatively lower charge mobility. According to embodiments of the present disclosure, under application of the radiation 120, the conductivity of a high resistivity substrate, such as glass may be significantly enhanced by imparting sufficient energy into electrons of the high resistivity material so that the electrons enter the so-called extended states in the conduction band. For narrow bandgap semiconductors including Si, low energy photons such as in infrared irradiation provide sufficient energy to overcome the bandgap. For wide bandgap semiconductor materials such as SiC, long wave UV radiation (315 nm-400 nm) may provide sufficient to overcome the bandgap and generate charge carriers. For such wavelength ranges, in various non-limiting embodiments, the illumination system 106 may be embodied as a light source, including a laser diode, light-emitting diode (LED), an arc lamp, or other source.

In accordance with additional embodiments, for substrates that are generally known as insulating substrates, such as glass substrates, other types of radiation sources may be used for illumination system 106, as detailed further below. Generally, the illumination system 106 will be arranged to provide radiation 120 having sufficient energy to generate mobile charge for the type of substrate being used as substrate 112. However, in various non-limiting embodiments, the illumination system 106 may be configured to clamp at least the following substrate types: 1) Regular silicon wafers: resistivity <1000 ohm-cm; 2) High resistivity silicon/or silicon-on-insulator (SOI) wafers: resistivity 1000 to 100,000 ohm-cm; 3) Silicon carbide wafers: available with resistivity up to 1E9 ohm-cm; and 4) Glass: resistivity >1E12 ohm-cm; 5) Silicon on glass.

According to various embodiments of the disclosure, the illumination system 106 is arranged to provide illumination to a main surface of the substrate 112, including a front surface 112A on the front side or back surface 112B on a back side. In accordance with different embodiments, the radiation 120 may be provided directly, in a line-of-sight manner, may be provide by reflection, may be provided through blanket illumination of a substrate, by scanning the substrate, by scanning an illumination source, or a combination of methods. Ideally a high intensity, uniform light illumination over an entire substrate is useful. Due to constraints on the configuring of light sources and electrostatic clamp apparatus, certain embodiments provide novel configurations to maximize the effectiveness of photogeneration in a substrate. In the embodiments of FIGS. 2-8 to follow, different electrostatic clamp systems are shown, where a substrate stage 202 is depicted, which substrate stage may include an electrostatic clamp, as generally described above with respect to FIG. 1.

Turning to FIG. 1A, there is shown a clamp apparatus 150 according to additional embodiments of the disclosure. In this case, the clamp apparatus 150 includes a mechanical clamp 154 (optionally including stand offs 156) to hold the substrate 112 using any suitable mechanical component. The clamp apparatus 150 includes the illumination system 106, described above. In operation, while the substrate 112 is held by the mechanical clamp 154, radiation 120 may be directed to the substrate 112 to increase mobile charges in the substrate 112 and to aid processing of the substrate, such as providing better electrical conduction between the substrate 112 and lift pins or ground pins (not separately shown) or by decreasing surface charging of the substrate 112.

FIG. 2 depicts a side view of an electrostatic clamp system 200, according to various embodiments of the disclosure. In this embodiment, an illumination system 201 is positioned to direct radiation 208 to the front surface of the substrate 112. While in some embodiments, the substrate stage 202 may be stationary, in other embodiments the substrate stage 202 may include scan components, such as known scan components (not shown) to scan the substrate 112 along at least one direction. Likewise, in some embodiments, the radiation 208 may be provided as a stationary beam, which beam is arranged to cover an entirety of the substrate. In some embodiments where the substrate stage 202 is arranged to scan the substrate, such as along the Y-axis of the Cartesian coordinate system shown, the radiation 208 may be provided in a manner to cover the entire scanning range of the substrate 112, as suggested in FIG. 2. For example, the illumination system 201 may include what is termed an illumination source 204, including components generating the radiation 208 at a suitable energy for generating photocarriers in the substrate 112, where examples of different illumination sources are detailed below. The illumination source 204 may generate radiation as a beam having a certain dimension. In some embodiments, the beam emitted by the illumination source 204 may be sufficiently large, or may expand to become sufficiently large to cover the substrate 112.

In other embodiments, the illumination system 201 may further include an optical system 206, arranged between the illumination source 204 and substrate 112, to expand the beam of radiation received from the illumination source 204 and to expand the beam of radiation to produce the radiation 208, in order to cover an entirety of the substrate 112. An example of a suitable optical system for optical system 206 is a set of refractive optics, such as an optical lens. In this embodiment and in embodiments to follow, an "optical system" will provide capability of treating radiation in the UV range, meaning that refractive optics will mean optics for refracting UV radiation, and a mirror optics will be suitable for reflecting UV radiation.

FIG. 3 depicts a side view of an electrostatic clamp system 220, according to various embodiments of the disclosure. In this embodiment, an illumination system 211 is positioned in a different manner to direct radiation 212 to the front surface of the substrate 112. While in some embodiments, the substrate stage 202 may be stationary, in other embodiments the substrate stage 202 may include scan components, such as known scan components (not shown) to scan the substrate 112 along at least one direction. Likewise, in some embodiments, the radiation 212 may be provided as a stationary beam, which beam is arranged to cover an entirety of the substrate. In some embodiments where the substrate stage 202 is arranged to scan the substrate, such as along the Y-axis of the Cartesian coordinate system shown, the radiation 212 may be provided in a manner to cover the entire scanning range of the substrate 112, as suggested in FIG. 3. For example, the illumination system 211 may include the illumination source 204, as discussed above with respect to FIG. 2. The illumination source 204 may generate radiation as a beam having a certain dimension. In this configuration the illumination source 204 may emit radiation as a beam that is not initially directed toward the substrate 112. The illumination system 211 may further include an optical system 210, arranged to reflect the beam generated by illumination source 204 and direct the reflected beam as radiation 212 to the substrate 112. The optical system 210 may include an optical mirror, while the optical mirror may be arranged as an expanding mirror in some embodiments, to expand the beam of radiation received from the illumination source 204, to reflect and to expand the beam of radiation to produce the radiation 212, in order to cover an entirety of the substrate 112. In additional embodiments, an illumination system may include a combination of refractive optics and mirror optics. The choice of optics for an illumination may be guided by considerations of spacing and placement of elements, as well as efficiency for generating illumination to cover the substrate 112.

FIG. 4 depicts a side view of another electrostatic clamp system 250, according to various embodiments of the disclosure. In this example, the electrostatic clamp system 250 may include a substrate stage 202, and illumination source 204, as generally described above. The electrostatic clamp system 250 may additionally include an illumination system 251 having an optical system 252, different than the embodiment of FIG. 2, in that the optical system 252 includes components to provide scanning capability for a beam of radiation that is received from the illumination source 204. The scanning capability may be provided by motorized components, for example. In accordance with various embodiments, the radiation 254 may be provided as a beam that is expanded from an initial beam size.

In accordance with various embodiments of the disclosure, the optical system 252 provides beam scanning of the radiation 254. In some embodiments, the optical system 252 may also scan the radiation so as to follow the scanning of the substrate 112, in configurations where the substrate 112 is scanned. For example, the illumination source 204 and optical system 252 may include refractive optics that generates the radiation 254 as a beam having a width that covers the substrate 112.

The optical system 252 may be further configured with a lens drive mechanism, arranged to move the optical lens by rotation, translation, or rotation and translation. For example, the optical system 252 may be further configured with a scanning component, wherein when the substrate 112 is scanned along the Y-axis at a rate of 10 cm per minute, the radiation 254 is scanned at the same rate in the same direction so as to cover the substrate 112 at any instance. In this manner, the width of the radiation 254, directed to the substrate 112 need not be substantially larger than the substrate width, even when the substrate 112 is scanned, thus protecting other components in the rest of a chamber housing the substrate 112.

In other embodiments, the radiation 254 may be provided as a relatively narrow beam in comparison to the width of the substrate 112, such as a laser beam or a highly collimated incoherent light beam. These other embodiments would be represented by the radiation beam shown as having a much smaller width, at least along the Y-direction, with respect to the width of the substrate 112. In these other embodiments, the optical system 252 may be provided with components to rapidly scan the radiation beam such as along the Y-direction, to cover an entirety of the substrate 112, in a manner that provides an average uniform irradiation. In embodiments where the substrate 112 remains stationary, the optical system 252 may therefore just scan the radiation beam in a rapid manner to generate a radiation umbrella that covers the stationary substrate.

FIG. 5 depicts a side view of another electrostatic clamp system 260, according to various embodiments of the disclosure. In this example, the electrostatic clamp system 260 may include a substrate stage 202, and illumination source 204, as generally described above. The electrostatic clamp system 260 may additionally include an illumination system 261 having an optical system 262, different than the embodiment of FIG. 3, in that the optical system 262 includes components to provide scanning capability for a beam of radiation that is received from the illumination source 204. The scanning capability may be provided by motorized components, for example. In accordance with various embodiments, the radiation 264 may be provided as a beam that is expanded from an initial beam size.

In accordance with various embodiments of the disclosure, the optical system 262 provides beam scanning of the radiation 264. In some embodiments, the optical system 262 may also scan the radiation so as to follow the scanning of the substrate 112, in configurations where the substrate 112 is scanned. For example, the illumination source 204 and optical system 262 may include reflective optics, such as a UV mirror, that generates the radiation 264 as a beam having a width that covers the substrate 112. The optical system 262 may be further configured with a scanning component, wherein when the substrate 112 is scanned along the Y-axis at a given rate, the radiation 264 is scanned at the same rate in the same direction so as to cover the substrate 112 at any instance. In this manner, the width of the radiation 264, directed to the substrate 112 need not be substantially larger than the substrate width, even when the substrate 112 is scanned, thus protecting other components in the rest of a chamber housing the substrate 112.

In other embodiments, the radiation from an illumination beam may be provided as a relatively narrow beam in comparison to the width of the substrate 112, such as a laser beam or a highly collimated incoherent light beam. This embodiment is represented by the electrostatic clamping system 270, shown in FIG. 6. The substrate stage 202 may be configured as in the aforementioned embodiments. In this embodiment, the illumination system 271 includes an illumination source 272 that generates a narrow beam shown as having a much smaller width, at least along the Y-direction, with respect to the width of the substrate 112. The illumination source 272 may be a laser source or a source of collimated incoherent light. In this embodiment, the optical system 274 may be provided with refractive components to receive and transmit the beam emitted from the illumination source 272 as a narrow beam, shown as radiation beam 276, and to scan the radiation beam 276, such as along the Y-direction, to cover an entirety of the substrate 112, in a manner that provides an average uniform irradiation.

In embodiments where the substrate 112 remains stationary, the optical system 274 may therefore just scan the radiation beam 276 in a rapid manner to generate a radiation umbrella 278, that covers the stationary substrate. In other embodiments where the substrate 112 is also scanned, such as along the Y-axis, the optical system 274 may include components to both rapidly scan the radiation beam 276 across the substrate 112, and to slowly shift the average position of the radiation beam 276 in synchronization with movement of the substrate. In this manner, the radiation beam 276 generates a radiation umbrella 278 whose dimension along the Y-axis closely corresponds to or matches the dimension of the substrate along the Y-axis, and whose position is arranged such that the radiation umbrella 278 overlaps the entirety of the substrate 112 or a desired portion of the substrate 112, while not extending beyond the substrate 112. More generally, the electrostatic clamping system 270 may include a synchronization component to synchronize movement of an optical lens and a substrate stage scanner (shown be the double arrows), so that a radiation beam remains aligned with the front side of the substrate 112 during scanning of the substrate 112. Another embodiment where a radiation beam is provided as scanned narrow beam is shown in FIG. 7. This embodiment is represented by the electrostatic clamping system 280, where the substrate stage 202 may be configured as in the aforementioned embodiments. In this embodiment, the illumination system 281 may include an illumination source 272 that generates a narrow beam, as described above with respect to FIG. 6. In this embodiment, the optical system 284 may be provided with components to reflect the beam emitted from the illumination source 272 as a narrow beam, shown as radiation beam 286, and to scan the radiation beam 286, such as along the Y-direction, to cover an entirety of the substrate 112, in a manner that provides an average uniform irradiation.

In embodiments where the substrate 112 remains stationary, the optical system 284 may therefore just scan the radiation beam 286 in a rapid manner, such as rapidly moving or rotating a mirror, to generate a radiation umbrella 288, that covers the stationary substrate. In other embodiments where the substrate 112 is also scanned, such as along the Y-axis, the optical system 284 may include components to both rapidly scan the radiation beam 286 across the substrate 112, and to slowly shift the average position of the radiation beam 286 in synchronization with movement of the substrate. In this manner, the radiation beam 286 generates a radiation umbrella 288 whose dimension along the Y-axis closely corresponds to or matches the dimension of the substrate along the Y-axis, and whose position is arranged such that the radiation umbrella 288 overlaps the entirety of the substrate 112 or a desired portion of the substrate 112, while not extending beyond the substrate 112.

In different embodiments where an optical system provides radiation to the substrate 112 as a scanned narrow radiation beam, the scanned radiation beam may be provided as a spot beam or ribbon beam within a plane of the substrate 112, meaning within the X-Y plane, as shown. FIG. 7B illustrates an embodiment where the radiation beam 276 or radiation beam 286 is provided as a ribbon beam, elongated along the X-axis. The ribbon beam may have a length dimension comparable to a length of the substrate 112 along the X-axis, and consequently may not be scanned along the X-axis, but just along the Y-axis, to generate the radiation umbrella 278 or radiation umbrella 288. FIG. 7C illustrates an embodiment where the radiation beam 276 or radiation beam 286 is provided as a spot beam, having a relatively smaller dimension compared to a width of the substrate 112 along the X-axis and consequently may be scanned both along the X-axis, and along the Y-axis, to generate the radiation umbrella 278 or radiation umbrella 288.

In additional embodiments, an electrostatic clamp system may include optics that combine mirror components and refractive components to direct a radiation beam to a substrate.

FIG. 8 depicts a side view of a still another electrostatic clamp apparatus according to various embodiments of the disclosure. In this embodiment, an electrostatic clamp system 290 is depicted that includes a substrate stage, previously described. Different than the previously described embodiments, the electrostatic clamp system 290 includes an illumination system 291 that includes a plurality of illumination sources. In the embodiment of FIG. 8 two different illumination sources are included, shown as illumination source 204A and illumination source 204B, where each illumination source may be configured similarly to illumination source 204, described previously. However, in other embodiments more than two illumination sources may be employed. In the configuration of FIG. 8, the illumination system 291 includes an optical system 292 that is arranged to direct two radiation beams to the substrate 112 using a mirror configuration of mirror system 292A and mirror system 292B to reflect radiation generated by the illumination source 204A and the illumination source 204B, and shown as radiation 294A and radiation 294B, respectively. In different variants, the optical system 292 may operate similarly to the aforementioned embodiments of FIG. 3, FIG. 5, or FIG. 7, for example, where a broad beam may be reflected to the substrate 112, of a narrower beam is reflected to the substrate, and slow or fast scanning of the radiation beams is provided, as described above. An advantage provided by the configuration of FIG. 8 is the ability to more uniformly illuminate the substrate 112, as compared to the use of a single radiation beam. In other embodiments, a plurality of illumination sources may be coupled to a respective plurality of refractive optical systems, similarly to the configurations of FIGS. 2, 4, and 6, to direct multiple radiation beams to the substrate 112, or multiple illuminations sources may be coupled to a combination of at least one refractive optical system and at least one mirror optical system. Such embodiments may be useful to accommodate an optical system within a given processing apparatus, for example, where the configuration of other components, including substrate stage, and processing components may place constraints upon the location of other components.

One drawback of directing illumination to the front surface of a substrate is that photocarriers tend to be generated near the front surface, while the clamping takes place on a back surface of the substrate. For high mobility materials the generation of photo-generated charge carriers near the front surface does not present a problem for clamping the substrate since the carries can rapidly traverse the substrate, but for low mobility materials such as glass, the charge carriers may an unduly long time to reach the back side of the wafer. In further embodiments of the disclosure, illumination systems may be arranged to direct illumination to the back side of a substrate.

FIG. 9 depicts a side view of an additional electrostatic clamp apparatus according to various embodiments of the disclosure. In this embodiment an electrostatic clamping system 300 is arranged with an illumination system 301, where at least a portion of the illumination system 301 is embedded within a substrate stage 302. Notably, the substrate stage 302 may be configured similarly to aforementioned embodiments of substrate stage 202, and may include an electrostatic clamp, as well as scanning components for scanning the substrate stage 302. The illumination system 301 may include a plurality of illumination sources, shown as illumination source 304, illumination source 306, and illumination source 308, distributed within the X-Y plane in a variety of locations. Generally, different illumination sources may be distributed across the substrate stage 302 in a one dimensional array or two dimensional array, where the substrate stage includes openings that face the substrate 112 to transmit radiation directly without obstruction to the back side including back surface 112B of the substrate 112. In other words, the gap between the substrate stage 302 and substrate 112 may be used as a hollow light guide so that radiation such as UV light goes beyond the point of entry.

While the embodiment of FIG. 9 illustrates an illumination system having multiple illumination sources, in other embodiments, a single illumination source may be employed. FIG. 10 depicts a side view of a another electrostatic clamp apparatus according to various embodiments of the disclosure. In this embodiment an electrostatic clamping system 310 is arranged with an illumination system 311, where a portion of the illumination system 311 is embedded within the substrate stage 312, and a portion is located outside the substrate stage 312. Notably, the substrate stage 312 may be configured similarly to aforementioned embodiments of substrate stage 202, and may include an electrostatic clamp, as well as scanning components for scanning the substrate stage 312. The illumination system 311 includes an illumination source 314, which source may represent just one illumination source. The illumination source 314 is coupled to a plurality of light guides (optical guides) that extend through the substrate stage 312 so that radiation may be provided directly to the back surface 112B of substrate 112. Generally, different light guides may be distributed across the substrate stage 312 in a one dimensional array or two dimensional array, where the substrate stage includes a plurality of openings 319 that face the substrate 112 to transmit radiation directly without obstruction to the back surface 112B of the substrate 112. For simplicity these light guides are shown as light guide 320, light guide 316, and light guide 318. As shown the plurality of optical guides are connected on a remote end to the illumination source 314, and have a proximate end extending through the plurality of openings 319, respectively.

The aforementioned embodiments of FIG. 9 and FIG. 10 thus provide an efficient manner to couple high energy radiation, such as UV radiation directly to a substrate, and in a uniform manner.

FIG. 11 depicts a side view of a another electrostatic clamp apparatus according to various embodiments of the disclosure. In this embodiment, an electrostatic clamp system 350 includes a substrate stage 352 that has an illumination system 351 embedded within the substrate stage 352. Notably, the substrate stage 352 may be configured similarly to aforementioned embodiments of substrate stage 202, and may include an electrostatic clamp, as well as scanning components for scanning the substrate stage 352. The illumination system 351 includes an illumination source 354, embedded in the substrate stage 352, and a set of coupling optics, shown as coupling optics 356, to receive radiation from the illumination source 354 and to output a radiation 358 in a direction to couple the radiation 358 to strike the back surface 112B of substrate 112. As shown in FIG. 11, the gap between the substrate stage 352 and substrate 112 may act as a hollow light guide.

While the aforementioned embodiments of FIGS. 2-11 are described with respect to an electrostatic clamp, in other embodiments the illumination systems of FIGS. 2-11 may be implemented with a mechanical clamp.

Figure 12:
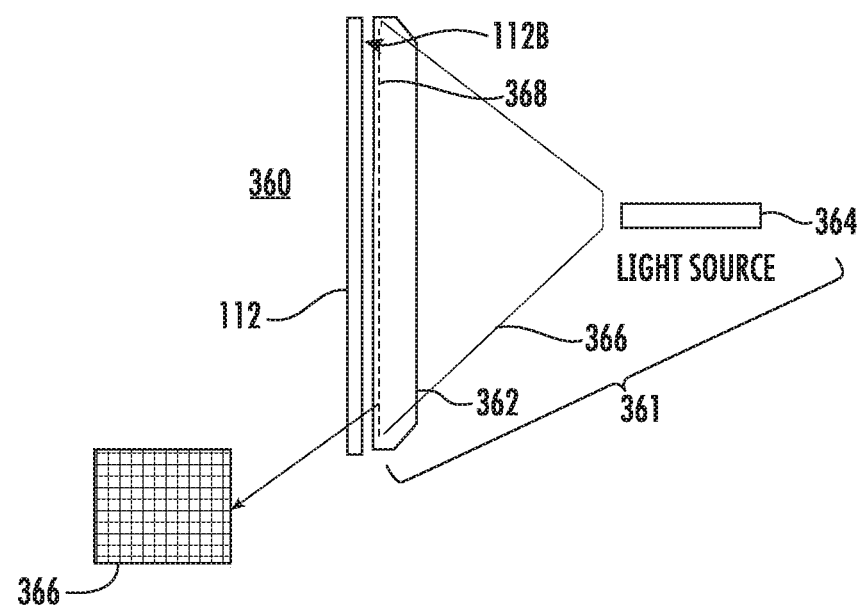
FIG. 12 depicts a side view of a still another electrostatic clamp apparatus according to various embodiments of the disclosure.

FIG. 12 depicts a side view of a still another electrostatic clamp apparatus according to various embodiments of the disclosure. In this embodiment, an electrostatic clamp system 360 includes an illumination system 361 that is formed form an illumination source, disposed to direct radiation 366 towards the back side of substrate 112 (see back surface 112B), and an electrode assembly 368, disposed within a substrate stage 362. Notably, the substrate stage 362 may be configured to include an electrostatic clamp, as well as scanning components for scanning the substrate stage 362. Unlike known electrostatic clamps, the substrate stage components, including electrostatic clamp components, may be formed of material that is transparent to the radiation 366. For example, dielectric material used for stage components and for an electrostatic clamp (including a transparent platen body), as well as cooling gas directed into the substrate stage 362 may be made of materials that are transparent to UV light used to form the radiation 366.

As shown in FIG. 12, the radiation 366 may form a broad radiation beam covering a large fraction of the substrate 112, or an entirety of the substrate 112. In this embodiment, an electrostatic clamp portion (not separately shown) of the substrate stage 362 includes the electrode assembly 368, arranged as one or more electrodes in the form of a metal screen or metal mesh, where the transparency of the metal mesh is high. In this manner, the metal mesh may act as a uniform electrode system for electrostatic clamping while providing high transparency to UV radiation or other high energy radiation emitted by illumination source 364.

Figure 13:
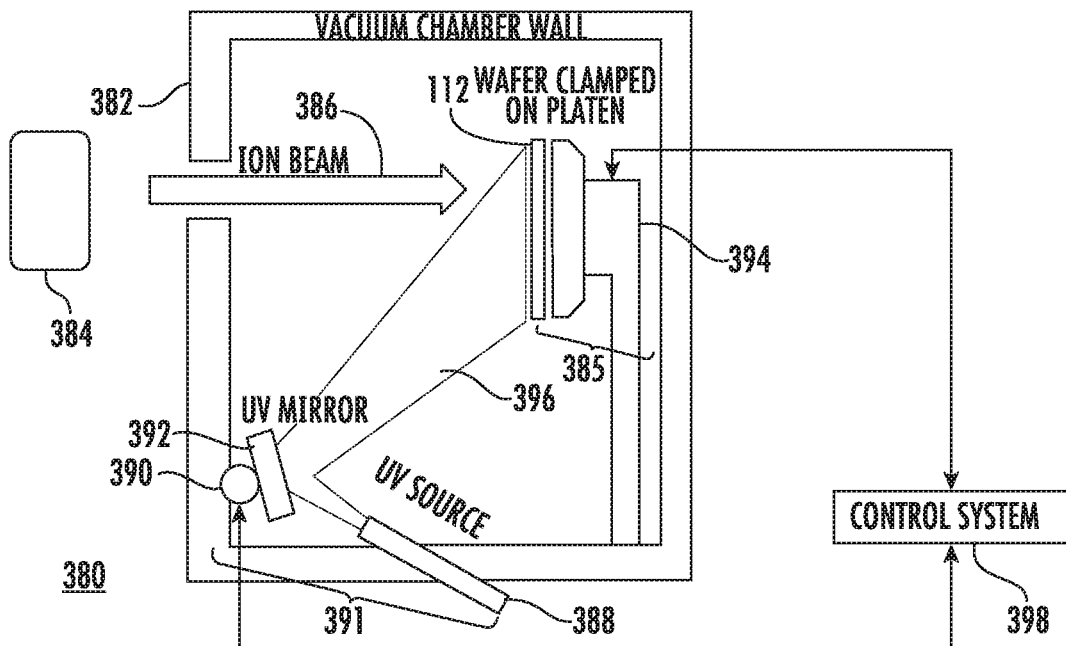
FIG. 13 depicts a side view of a processing system according to various embodiments of the disclosure.
Figure 14:
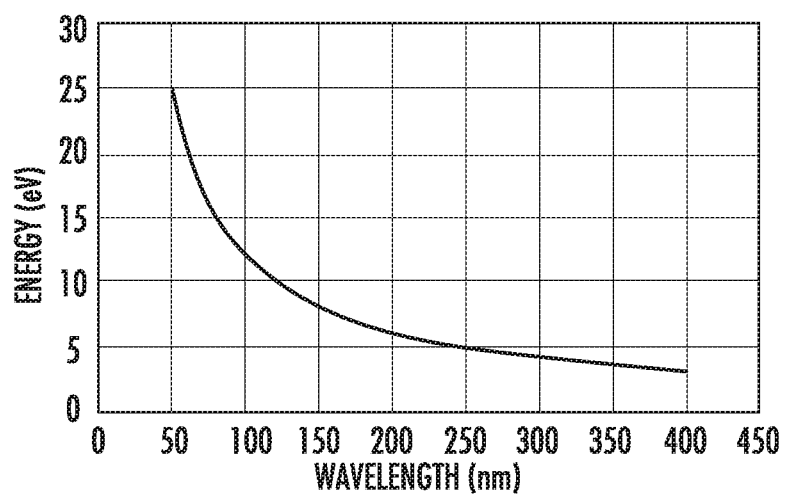
FIG. 14 illustrates the relationship between radiation wavelength and energy.

In additional embodiments of the disclosure, an electrostatic clamping system, including those embodiments disclosed with respect to FIGS. 1-12, or variants thereof, may be deployed in a substrate processing system, to process a substrate. In some embodiments an electrostatic clamping system is provided in a substrate processing chamber so that a substrate may be held while being processed. FIG. 13 depicts a side view of one such processing system according to various embodiments of the disclosure. As shown, a processing system 380 includes a process chamber 382 that may house various components of an electrostatic clamping system, including a substrate stage 385 and an illumination system 391. In the configuration shown, the illumination system 391 includes reflective optics for front side illumination, while in other embodiments, the illumination system may be based on refractive optics for front side illumination, or may be based upon backside illumination, where these various configurations have been detailed with respect to FIGS. 1-12. In this example, an illumination source 388 is provided externally to the substrate stage 385. The illumination source 388 may be disposed within the process chamber 382, partially within the process chamber 382, or externally to the process chamber 382, in different embodiments. In the example of FIG. 13, the illumination source 388 directs a beam to a UV mirror 392 that reflects the beam to direct the radiation 396 to the substrate 112. The geometric configuration of the illumination source 388, UV mirror 392, and substrate 112 is arranged to ensure that the source UV beam generated by the illumination source 388 is properly expanded to cover the substrate. Similarly to some of the aforementioned embodiments, a mirror drive mechanism may be incorporated and arranged to move an optical mirror, such as the UV mirror 392, by rotation, translation, or rotation and translation. As shown in the embodiment of FIG. 13, a scanning motor 390 is mechanically coupled to the UV mirror 392 to scan the UV mirror 392 in a manner that follows the movement or scanning of the substrate 112, as discussed above. In some implementations, the scanning of the UV mirror 392 and the substrate stage 394 is controlled using a control system 398 that is coupled to the UV mirror 392 and substrate stage 394 so that the expanded beam (radiation 396) follows the substrate movement in a manner where the radiation 396 is mostly or entirely intercepted by the substrate 112. Thus, the control system 398 may generate scan control and position sensing signals for controlling substrate stage 394, as well as optical beam scan control and position sensing signals for controlling scanning motor 390 and UV mirror 392.

The UV photons of the radiation 396 are provided to generate enough mobile charges such that the substrate, even if having a high bandgap, above 2.5 eV, can be adequately clamped by an electrostatic clamp (not separately shown) within the substrate stage 394.

The processing system 380 further includes a beam generating component 384, to direct an ion beam 386 into the process chamber 382. While the substrate 112 is being held in place by the action of an electrostatic clamp system including the illumination system 391 and electrostatic clamp within the substrate stage 394, the ion beam 386 may implant ions into the substrate 112. Unlike known ion implantation systems, the processing system 380 may conveniently implant into high resistance or insulating substrates where the substrates are nevertheless electrostatically clamped to a substrate stage.

While in the embodiment shown in FIG. 13, the beam generating component 384 may represent a series of beamline components to transport an ion beam to a substrate, in other embodiments a process system including the aforementioned embodiments of an electrostatic clamping system may be used to process substrates for any suitable process, including film deposition, etching, heating, and so forth.

Figure 15:
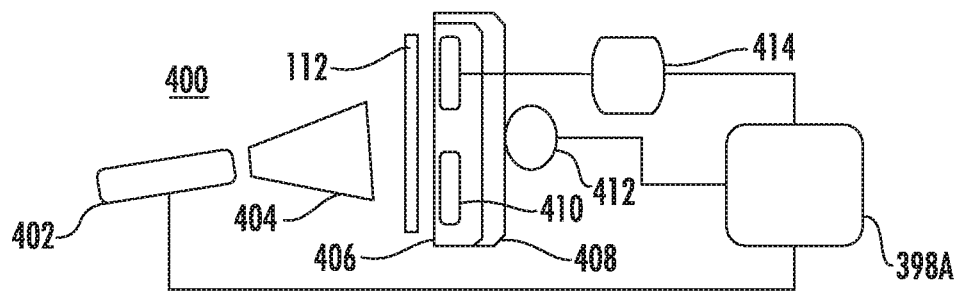
FIG. 15 illustrates an exemplary control system for electrostatic clamping according to some embodiments.

In various embodiments of the disclosure, the control system 398 or similar control systems may be used to enhance the ability of a UV illumination system or high energy illumination system to aid electrostatic clamping of high resistivity substrates. Notably, depending upon the configuration of a process chamber and the capabilities of an illumination source, the irradiation of a substrate may need to be synchronized with substrate scanning and electrical clamping of a substrate to improve the effectiveness of the radiation. As noted previously, when a scanning UV beam is used to illuminate a substrate, the control system 398 may synchronize the UV beam scanning with scanning of the substrate stage. FIG. 15 illustrates an exemplary control system arrangement 400 for electrostatic clamping according to some embodiments. In this example, a controller 398A is coupled to various components of an electrostatic clamping system. An illumination system 402 directing radiation 404 to a front side of the substrate 112 is shown for simplicity, without any optical components. Notably the illumination system 402 may include components to scan the radiation 404 as described above. An electrostatic clamp 406 is provided in a substrate stage 408, and includes an AC electrode system 410. A motor 412 is coupled to the substrate stage to scan the substrate stage 408. In addition an AC voltage source 414 is coupled to the AC electrode system 410 to supply voltage signals, including AC voltage to electrodes of the AC electrode system 410. The controller 398A may be coupled to the illumination system 402, the motor 412, as well as the AC voltage source 414 to synchronize action of these components. For example, the timing of irradiating the substrate 112 may be synchronized with electrical excitation to the substrate, using the controller 398A. In some implementations, the controller 398A may be used to direct the AC voltage source 414 to provide a given voltage waveform whose amplitude, AC frequency, and rise time are arranged to ensure sufficient photocarriers can be generated within a same half-period of AC voltage. The details of the given voltage waveform may be based upon the available UV intensity generated by the illumination system 402.

In particular embodiments, the controller 398A may monitor the current clamp signal of the electrostatic clamp 406 to determine the charging status of a substrate 112. In some embodiments, before starting of substrate clamping, the wafer type may also be sensed using a clamp current signal.

EXAMPLES

Illumination Sources

In accordance with some embodiments, the illumination system 106 or any of the other aforementioned illumination sources may be a visible light source. These embodiments of a visible light source will be especially suitable for use with low bandgap semiconductor substrates, such as silicon, III-V compound semiconductors, II-VI compound semiconductors, where bandgap may be below approximately 2.5 eV.

In accordance with other embodiments, the illumination system 106 or any of the other aforementioned illumination sources may be a long wavelength UV source, generating radiation in the wavelength range of 120 nm to 240 nm, meaning energy range of approximately 3 eV to 4 eV. These embodiments of a UV radiation source will be especially suitable for use with wide bandgap semiconductor substrates, such as silicon carbide.(SiC).

In accordance with further embodiments, the illumination system 106 or any of the other aforementioned illumination sources may be a VUV source, generating radiation in the wavelength range of 120 nm to 240 nm, or lower meaning energy range of approximately 5 eV to 10 eV or higher. These embodiments of a VUV radiation source will be especially suitable for use with insulator substrates, such as glass.

In some examples, any of the aforementioned illumination sources may be multiwavelength sources, where a wide range of wavelengths is available, either from a single illumination source, or from multiple different illumination sources. The same electrostatic clamp system may thus employ light sources with multiple wavelengths, where the shortest wavelength source is selected for substrates with the highest energy bandgap, while for substrates requiring less photon energy to bridge the bandgap, sources with longer wavelengths and higher radiation flux can be selected to achieve higher conductivity.

While in some examples, a laser may be employed to generate a single wavelength radiation, in other examples, non-coherent light sources may be used to generate either radiation characterized by a continuous wavelength spectrum, of a discrete wavelength spectrum, with power highly centered about a small number of resonant spectral lines (frequencies).

In particular examples, the output wavelength spectrum from an illumination source may be further tailored using filters. For example, for some substrate processing applications a silicon wafer is bonded to glass substrates using UV-sensitive adhesives. If longer wavelengths transparent to the glass are filtered out from radiation emitted by an illumination source, using a filter disposed between the illumination source and the substrate, the shorter wavelength portion of the radiation may then be used to generate photocarriers within the glass without penetrating entirely through the glass & damaging the adhesive.

Non-limiting examples of suitable laser sources include diode lasers generating wavelengths down to 191 nm, other solid state lasers, excimer lasers, such as ArF, KrF, $F_2$, continuous wave lasers, pulsed lasers, and so forth.

Figure 19:
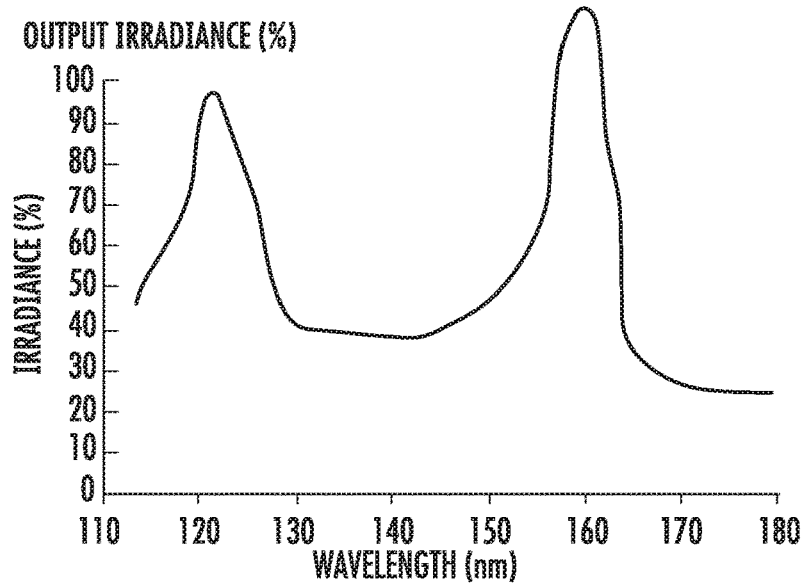
FIG. 19 illustrates another exemplary irradiance curve for a radiation source suitable for use in an electrostatic clamp apparatus of the present embodiments.

Examples of suitable non-coherent sources include deuterium lamps, electrodeless lamps, including line sources or continuous wavelength sources. An example of a deuterium lamp source output spectrum is shown in FIG. 19, with certain details omitted for clarity. The output of such a source may be suitable to generate charge carriers in insulators having a bandgap above 6 eV or so. Some examples of commercially available resonant line sources are shown in table I. including type of source and wavelength(s) of radiation. Some examples of commercially available continuum sources are shown in table II.

TABLE I

| | (nm) |
|---|---|
| HYDROGEN | 121.6 |
| KRYPTON | 116.5 |
| | 123.6 |
| XENON | 129.6 |
| | 147.0 |
| MERCURY | 184.9 |
| | 253.7 |
| IODINE | SEVERAL |

TABLE II

| | (nm) |
|---|---|
| ARGON | 110-140 |
| KRYPTON | 127-160 |
| XENON | 150-190 |

Figure 17:
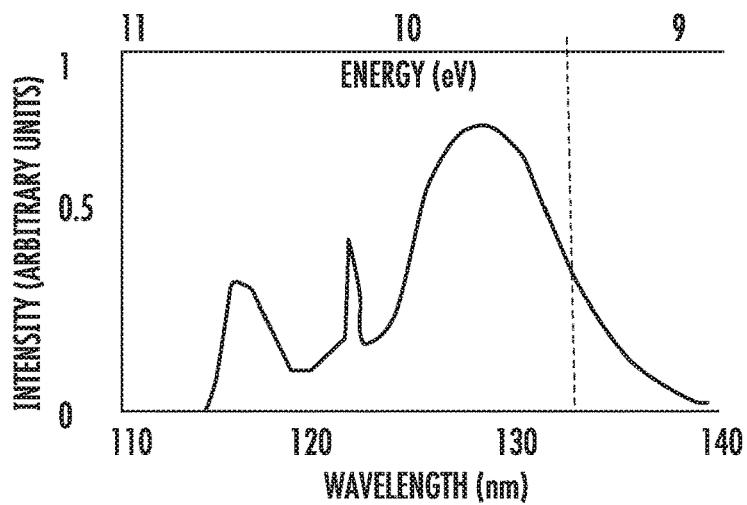
FIG. 17 illustrates an exemplary irradiance curve for a radiation source suitable for use in an electrostatic clamp apparatus of the present embodiments.
Figure 18:
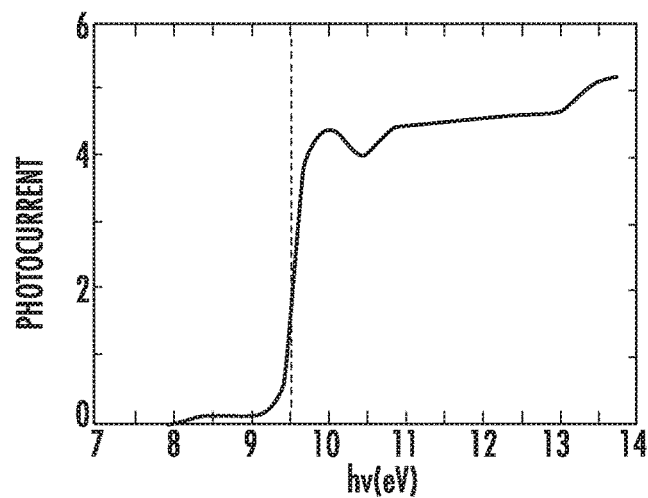
FIG. 18 illustrates generation of photocurrent as a function of radiation energy for $SiO_2$.

In one example, a VUV argon continuum source is used as an illumination source to aid in the electrostatic clamping of a glass or fused silica substrate. Fused silica has a bandgap of approximately 8 eV, which bandgap requires light sources with wavelengths <150 nm in order to generate photocarriers. FIG. 18 shows the photocurrent generated by a glass substrate as a function of photon energy. As shown, below 8 eV no photocurrent is generated, with a gradual rise until a photon energy of 9 eV is reached, above which energy, a rapid increase in photocurrent takes place, with a saturation in photocurrent at 10 eV or above. A reference dashed line at 9.5 eV is shown. In one embodiment an ArCM-LHP high power Argon continuum source may be used, generating an output spectrum as shown in FIG. 17. The output spectrum is idealized, omitting certain minor details, while showing the general features of an Argon emission spectrum. As illustrated, the peaks wavelengths range between 116 nm and 140 nm, where the majority of the integrated intensity of the broad emission spectrum is located at wavelengths below approximately 133 nm (represented by the dashed line), equivalent to 9.5 eV energy or greater. This energy ranges matches the energy range where photocurrent generation in glass is substantial, as shown in FIG. 18. Such sources are commercially available in a relatively compact footprint so as to be readily attached to common processing chambers.

UV Mirrors

In one example, an aluminum mirror having an $MgF_2$ coating may be used as a UV mirror to generate high reflectance in the UV and VUV range. Commercially available mirrors based upon such materials may generate reflectance above ~75% over a wavelength range from at least 300 nm down to 120 nm, providing efficient reflectance of an initial UV beam. Such high reflectance will facilitate beam expansion and steering using well-known methods used for visible light mirror systems.

Enabling of Electrostatic Clamping Using Argon Arc Lamp for AC Clamping of a Glass Substrate:

As noted, without the presence of photocarriers, for example, as generated according to the aforementioned embodiments, when attempting to clamp an insulating substrate (dielectric substrate) the clamp electrodes of an electrostatic clamp (e-clamp) establish an electric field throughout the dielectric.

Using front-side illumination as disclosed above, charge carriers are generated at the top of the insulating substrate. Under the influence of the applied electric field the carriers move towards the back surface of the substrate (see FIG. 1B). The result of this process is that the electric field in the gap between the substrate and the e-clamp is enhanced. Without the generation of the charge carriers the electric field in the gap is on the order of V/w, where V is the voltage difference between electrodes and w is the spacing between electrodes. If a surface charge layer is fully developed as shown in FIG. 1B, then the electric field in the gap is on the order of V/d, where d is the dielectric thickness of the gap and dielectric material between the substrate and the electrodes. This thickness is typically much smaller than the electrode spacing. An enhancement of electric field of 10× to 100× can be readily achieved, which field enhancement corresponds to 100× to 10,000× enhancement in clamping force. Thus, a useful goal is to establish sufficiently high surface charge density within sufficiently short time to realize the potential benefit of the increased clamping force. For example, for effective AC clamping, the time for charge accumulation needs to be much shorter than the period of the applied AC voltage.

In the calculations to follow it is assumed that a known ArCM-LHP lamp is used as an illumination source generating a radiation spectrum as shown in FIG. 18, where the lamp can deliver $6 \times 10^{16}$ photons/second/steradian with a photon energy above the SiO2 bandgap of ~8 eV, and an output angle of $2\theta = 45°$, corresponding to a solid angle of $$\Omega = 4\pi \sin^2 \frac{\theta}{2} = 0.48.$$

For different output angles and photon flux, the calculations may be quantitatively adjusted as will be appreciated by those of skill in the art. A UV mirror may also be used that introduces reflection loss to the beam output by the lamp. Further, the expanded beam area may be assumed to be somewhat larger than the substrate area, which situation also reduces the utilization of the beam flux. It will be assumed that the mirror losses and off-substrate beam losses together result in 50% loss of usable beam flux. This assumption indicates a photon flux of $1.45 \times 10^{16}$ photons/second on the substrate, or $\Phi = 2 \times 10^{13}$ photons/sec/cm$^2$ for a 300 mm wafer. The transportation of photocarriers in silicon dioxide has been previously extensively studied experimentally and numerically. Photoconduction is a complicated process. Conduction current is affected by light absorption, quantum yield, life time of the mobile carriers (which lifetime depends on recombination and trapping rates and can be very different for electrons and holes), electron and hole mobilities (which mobilities may differ by many orders of magnitude), space charge accumulation in the insulator, and charge transfer across the interface between substrate and e-clamp. Accordingly, estimating the current based on basic materials properties is not suitably reliable, and instead the current calculations herein are based on experimentally measured photocurrent. In one particular example, an e-clamp is designed such that an electric field strength of 5 kV/mm is achieved in a glass substrate. Results of known studies suggests a conduction current density of $7.6 \times 10^{-9}$ A/cm$^2$ will be generated under a flux of $5 \times 10^{11}$ photons/sec/cm$^2$ at the above value of electric field. With the higher lamp intensity used in this example ($2 \times 10^{13}$ photons/sec/cm$^2$), the current density is estimated to be $J = 3 \times 10^{-7}$ A/cm$^2$. Under experimental conditions where the targeted clamping pressure is 50 torr, then the required charge density to generate such a clamp force is given by:

$$Q = \sqrt{2\epsilon_0 F} = 3.43 \times 10^{-8} \text{ C/cm}^2$$

Therefore, the characteristic charging time in this example is given by:

$$\tau = \frac{Q}{J} = 0.11 \text{ sec}$$

This time is fast enough for low frequency AC excitation, for example, with 1-2 Hz frequency, or 500 ms to is period. Note that this estimation of characteristic charging time is an order of magnitude estimate for the response time using a realistic e-clamp electrical design and commercially available VUV sources. The estimate shows the feasibility to realize practical AC clamping using the aforementioned method for insulating glass wafers. In other examples, the charging time can be shortened to below 0.1 seconds by using multiple light sources to increase the VUV intensity, and to optimize the e-clamp electrical design and increase the electric field.

Clamping of High Resistivity Si and SiC Wafers

As noted, commercially available HBR silicon wafers may exhibit resistivity in the range of 100 kOhm-cm are available. For SiC substrates, $10^9$ Ohm-cm resistivity has been reported. However, practical systems to generate photo carriers in common HBR semiconductor substrates may employ UV light sources with main energy output at somewhat longer wavelengths (>250 nm) than for $SiO_2$ substrates, since the bandgap in Si and SiC is much smaller than for $SiO_2$. Moreover, the crystalline semiconductors like Si and SiC have high electron and hole mobilities and less defects to generate trapping compared to glasses, which structure also helps to decrease the transit time of the photocarriers under electric field. Accordingly, given the above experimentally based results suggesting an charging time of ~0.1 sec for SiO2, charging times significantly less than this time may be realized for HBR Si and HBR SiC substrates may be realized using exemplary illumination sources and clamp arrangements as disclosed herein.

While the aforementioned embodiments focus on clamping enhancement of high resistivity substrates using high energy illumination, declamping may also be enhanced according to additional embodiments. In other words, when a semiconductive or insulative substrate is being clamped using an electrostatic clamp, at the instance where the substrate is to be declamped, a clamping voltage may be removed. To enhance the declamping of the substrate, photocarriers may be generated by exposure to an illumination source according to the embodiments disclosed hereinabove. In this manner, the decay rate of the previously established electric field and removal of certain charges such as neutralizing residual static charges may be sped up. This enhancement may apply to "regular" semiconductive substrates having relatively low bandgaps, such as in the visible range, as well as for HBR semiconductor substrates and insulator substrates.

Figure 20:
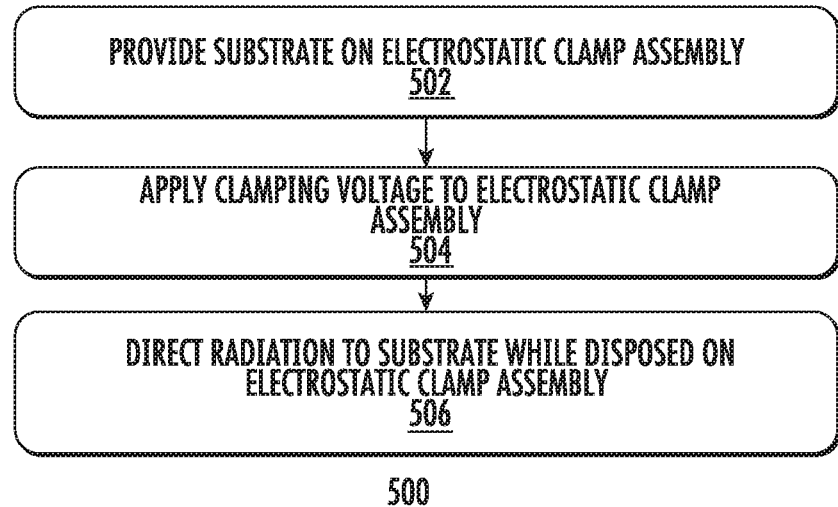
FIG. 20 illustrates an exemplary process flow.

FIG. 20 illustrates an exemplary process flow 500. At block 502, a substrate is provided on an electrostatic clamp assembly. The substrate in some embodiments may be an HBR semiconductor substrate or an insulating substrate. At block 504, a clamping voltage is applied to the electrostatic clamp assembly, such as a DC voltage or AC voltage. At block 506, radiation is directed to the substrate while the substrate is disposed on the electrostatic clamp assembly. The radiation may be characterized by an energy that is greater than a bandgap of the HBR semiconductor substrate or insulating substrate. The radiation may be directed to a front surface of the substrate or two a back surface of the substrate. As such, the radiation may be of sufficient energy and sufficient intensity to generate charge carriers within the substrate that result in a targeted clamping force when the clamping voltage is applied.

Figure 21:
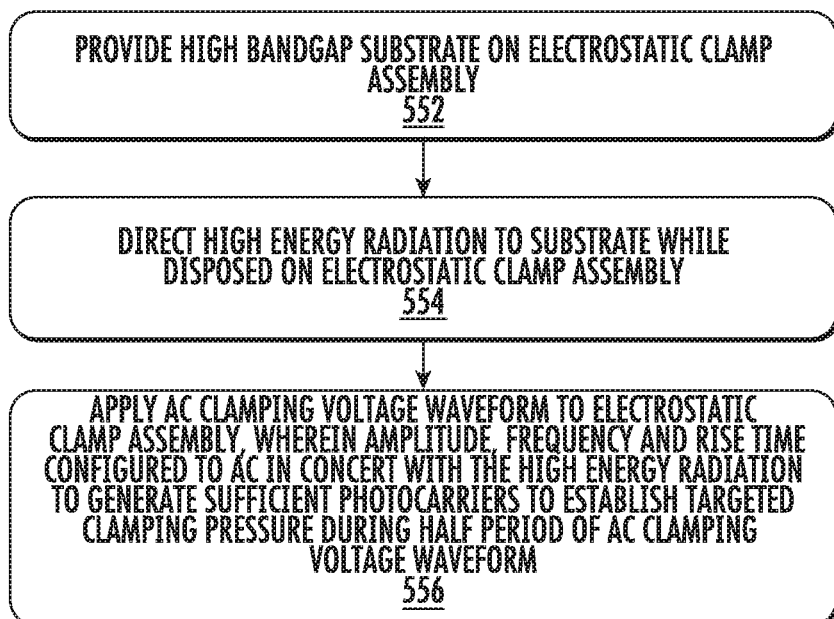
FIG. 21 illustrates another exemplary process flow.

FIG. 21 illustrates another process flow 550 according to additional embodiments. At block 552 a high bandgap substrate is provided on an electrostatic clamp assembly. At block 554 high energy radiation is directed to the substrate while disposed on the electrostatic clamp assembly. The high energy radiation may have an energy above the bandgap of the substrate, where the energy may be sufficiently above the bandgap to generate charge carriers in the substrate. Non-limiting examples of high energy radiation include UV radiation or VUV radiation, At block 556, an AC clamping voltage waveform is applied to the electrostatic clamp assembly, characterized by an amplitude, a frequency and a rise time. As such, the AC clamping voltage waveform, in conjunction with the high energy radiation, may be configured to generate sufficient photocarriers to established a targeted clamping pressure during a half period of the AC clamping voltage waveform.

Figure 22:
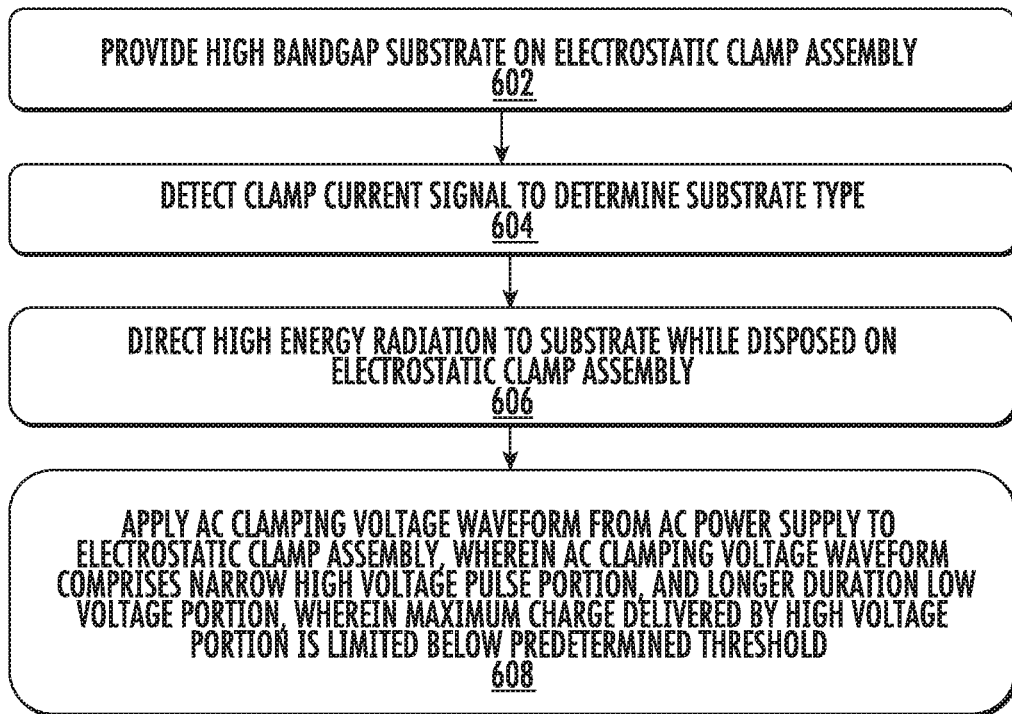
FIG. 22 illustrates a further exemplary process flow.

FIG. 22 illustrates another exemplary process flow 600. At block 602 a high bandgap substrate is provided on an electrostatic clamp assembly. At block 604, a clamp current signal is detected to determine a substrate type of the high bandgap substrate. At block 606, high energy radiation is directed to the substrate while disposed on the electrostatic clamp assembly. At block 608, an AC clamping voltage waveform is applied from an AC power supply to the electrostatic clamp assembly. As such the AC clamping voltage waveform may be characterized by a narrow high voltage pulse portion and a longer duration low voltage portion, wherein the maximum charge delivered by the high voltage pulse portion is limited below a predetermined threshold.

Figure 23:
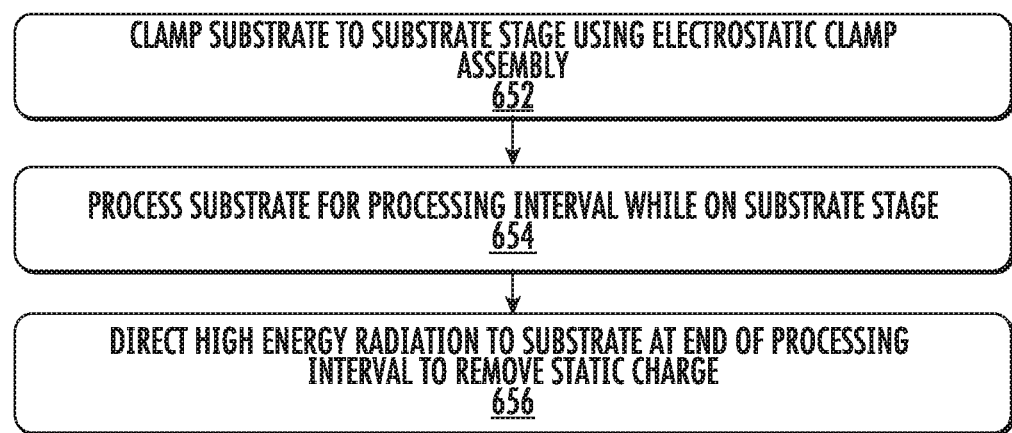
FIG. 23 illustrates an additional exemplary process flow.

FIG. 23 illustrates another exemplary process flow 650. At block 652 a substrate is clamped to a substrate stage by an electrostatic clamp assembly. The substrate may be a silicon substrate, silicon carbide substrate, glass substrate or other substrate. The substrate may be a low bandgap substrate or a high bandgap substrate. At block 654, the substrate is processed while on the substrate stage. The processing may be any suitable process. At block 656 high energy radiation is directed to the substrate at the end of processing to remove static charge. The high energy radiation may be an energy above the bandgap of the substrate. The high energy substrate may be applied while clamping voltage generated by the electrostatic clamp assembly is removed.

Figure 24:
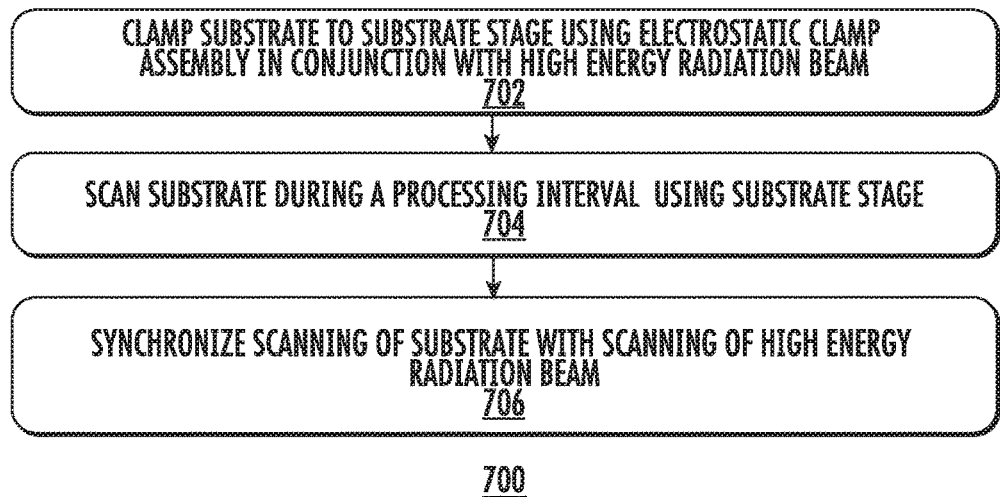
FIG. 24 illustrates another exemplary process flow.

FIG. 24 illustrates another exemplary process flow 700. At block 702 a substrate is clamped to a substrate stage using an electrostatic clamp in conjunction with high energy radiation. The high energy radiation may have an energy above a bandgap of the substrate, and an intensity sufficient to generate charge carrier movement in the substrate adequate to generate a targeted clamping pressure. At block 704 the substrate is scanned while using the substrate stage during a processing interval. At block 706 the scanning of the substrate by the substrate is synchronized with scanning of the radiation beam. In some variants, the radiation beam may be a broad beam covering a majority of the substrate, where the scanning of the radiation beam involves scanning the broad beam at the same rate as the scanning of the substrate, to ensure the radiation beam is intercepted mostly or entirely by the substrate. In some variants, the radiation beam may be a narrow beam covering a narrow portion of the substrate, where the scanning of the radiation beam involves scanning the narrow beam rapidly back and forth to cover a targeted portion of the substrate generating a beam umbrella or envelope, while superimposing a slower scan rate at the same rate as the scanning of the substrate, to ensure the beam envelope is intercepted mostly or entirely by the substrate, as the substrate moves.

While aforementioned embodiments focus on application related to substrate clamping, in further embodiments, apparatus and techniques may be applied to reduce charging in substrates in various processing environments. In various processing apparatus, including plasma apparatus, ion beam apparatus, and other apparatus, charged particles, including ions (ion species) or electrons may act as processing species to process a substrate, where charging may take place in a substrate during processing. This situation is especially acute for the new types of substrates, such as SiC, silicon-on-insulator (SOI) substrate, and glass, where such substrates may develop charge during processing that is not removed due to the low mobility of charge carriers in such substrates.

Figure 25:
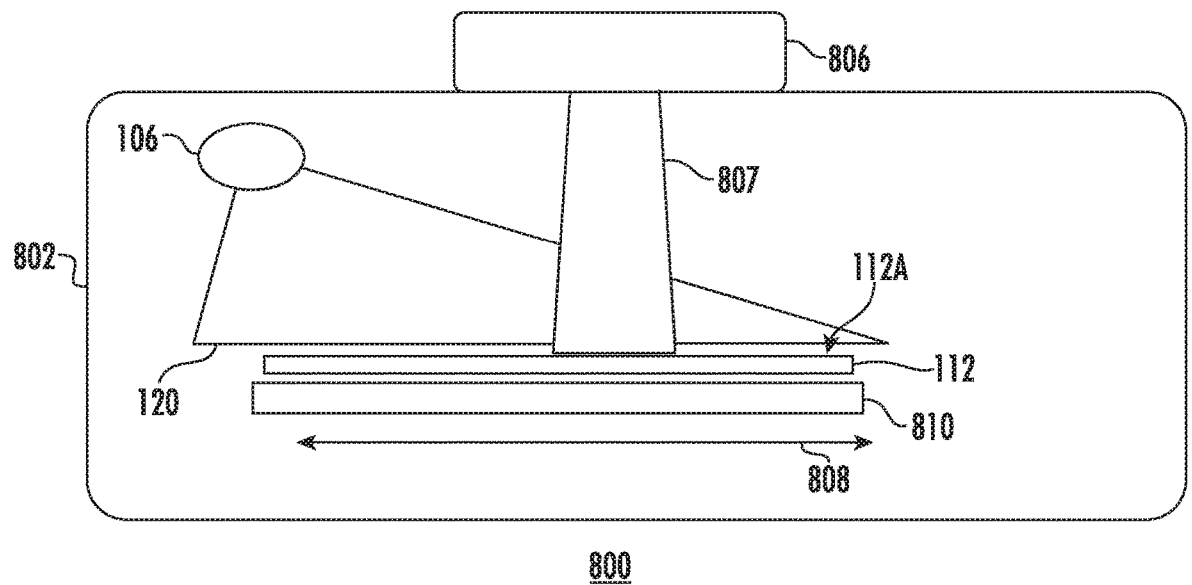
FIG. 25 depicts an embodiment of a processing system.

In accordance with embodiments of the disclosure, illumination systems, such as those disclosed with respect to FIGS. 1-13, and 15, may be provided in processing apparatus to facilitate charge removal during substrate processing. FIG. 25 depicts an embodiment of a processing system 800, to process a substrate 112. The processing system 800 may include a source 806 to direct processing species, such as an ion beam, electron beam, or plasma, to the substrate 112, according to various non-limiting embodiments. Merely for purposes of illustration, the example of FIG. 25 shows a processing beam 807, directed to the substrate 112. The substrate 112 may be supported by a substrate holder 810. In sum embodiments, the substrate is scanned along the direction 808, for example, when the processing beam 807 does not cover the entirety of the substrate 112, in order that the entirety of the front surface 112A of the substrate 112 be exposed. An illumination system 106 may be provided to direct illumination to a main surface of the substrate 112, generally as described above. According to some embodiments, the substrate 112 may be an electrical insulator, high bandgap semiconductor, or other substrate having relatively low charge mobility. During processing by the processing beam 807, the substrate 112 may tend to build up charge on the front surface 112A, for example. The illumination system 106 may be activated to direct radiation 120 to the substrate 112 to reduce or eliminate the charge buildup on the substrate 112, and accordingly improve the substrate processing.

In some embodiment, the following procedure may be followed. The substrate 112 is provided in the process chamber 802. Radiation 120 is directed from the illumination system 106 to the substrate 112 when the substrate is disposed in the process chamber 802. The substrate 112 is processed providing a processing species to the substrate 112 within the processing beam 807, separate from the radiation 120 provided by the illumination system 106, when the substrate is disposed in the process chamber 802. According to particular embodiments, at least a portion of the radiation energy of the radiation 120 is equal to or greater than 2.5 eV, to generate energy above bandgap for a given substrate. While the radiation 120 and processing beam 807 are directed to the substrate simultaneously to one another, the duration of the radiation 120 and processing beam 807 need not be the same, and the radiation 120 may be initiated before initiation of the processing beam 807, or after, and may be terminated before or after termination of the processing beam 807.

The present embodiments provide at least the following advantages. For one, practical approaches have been developed to realize electrostatic clamping of high resistivity substrates, where known electrostatic clamps are not suitable. For another advantage, in configurations where an illumination source in mounted on a substrate stage, the illumination of the substrate is not affected by movement of the substrate, such as substrate scanning. For another advantage, the application of novel voltage waveforms may further enhance the electrostatic clamping process. For a further advantage, the use of photoillumination to enhance electrostatic clamping may also be used to enhance declamping. In addition, as another advantage, the illumination may be used to increase and control substrate temperature.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus, comprising:
a clamp to clamp a substrate wherein the substrate has a front side and a back side opposing the front side and the clamp is arranged opposing the back side of the substrate;
an illumination system, disposed to direct radiation to the back side of the substrate, when the substrate is disposed on the clamp, wherein the radiation comprises a radiation energy, the radiation energy being equal to or above a threshold energy to generate mobile charge in the substrate,
wherein the clamp is an electrostatic clamp that comprises a plurality of openings that face the substrate to transmit the radiation directly to the substrate, and wherein the illumination system comprises a plurality of radiation sources distributed across a substrate stage, disposed to direct the radiation through the plurality of openings of the electrostatic clamp; and
wherein the electrostatic clamp defines a gap between the electrostatic clamp and the substrate stage, wherein the gap defines a hollow light guide for the radiation.

2. The apparatus of claim 1, wherein the clamp is an electrostatic clamp that comprises a plurality of openings, the apparatus further comprising:
a plurality of optical guides, the plurality of optical guides connected on a remote end to an illumination source, and having a proximate end extending through the plurality of openings, respectively.

3. The apparatus of claim 1, wherein the clamp is an electrostatic clamp that comprises:
a transparent platen body, the transparent platen body being transparent to the radiation; and an electrode, the electrode being arranged as a metal mesh, wherein a transparency of the metal mesh is above 50%.

4. The apparatus of claim 3, wherein the radiation comprises a broad beam covering the mesh.

5. A substrate processing system, comprising:

a process chamber;

an electrostatic clamp, disposed in the process chamber, the electrostatic clamp to clamp a substrate wherein the substrate has a front side and a back side opposing the front side and the electrostatic clamp is arranged opposing the back side of the substrate; and an illumination system, disposed to direct radiation to the back side of the substrate, when the substrate is disposed on the electrostatic clamp, wherein the radiation comprises a radiation energy, the radiation energy being equal to or above 2.5 eV, wherein the electrostatic clamp comprises a plurality of openings that face the substrate to transmit the radiation directly to the substrate and wherein the illumination system comprises a plurality of radiation sources distributed across a substrate stage, disposed to direct the radiation through the plurality of openings of the electrostatic clamp; and wherein the electrostatic clamp defines a gap between the electrostatic clamp and the substrate stage, wherein the gap defines a hollow light guide for the radiation.

6. The substrate processing system of claim 5, wherein the electrostatic clamp comprises a plurality of openings, the processing system further comprising:

a plurality of optical guides, the plurality of optical guides connected on a remote end an illumination source, and having a proximate end extending through the plurality of openings, respectively.

7. The substrate processing system of claim 5, wherein the electrostatic clamp comprises:

a body, the body being transparent to the radiation; and an electrode, the electrode being arranged as a metal mesh, wherein a transparency of the metal mesh is above 50%.

8. The substrate processing system of claim 7, wherein the radiation comprises a broad beam covering the mesh.

9. The substrate processing system of claim 5, further comprising an AC power supply to apply an AC clamping voltage waveform to the electrostatic clamp. wherein the AC clamping voltage waveform comprises a short high voltage pulse portion and a long low voltage portion.

* * * * *